(12) United States Patent
Martinez (10) Patent No.: US 9,583,478 B1
(45) Date of Patent: Feb. 28, 2017

(54) LATERAL POWER MOSFET

(75) Inventor: Marcelo A. Martinez, Davis, CA (US)

(73) Assignee: Silego Technology, Inc., Santa Clara, CA (US)

( * ) Notice: Subject to any disclaimer, the term of this patent is extended or adjusted under 35 U.S.C. 154(b) by 215 days.

(21) Appl. No.: 13/089,194

(22) Filed: Apr. 18, 2011

Related U.S. Application Data (60) Provisional application No. 61/342,591, filed on Apr. 16, 2010.

(51) Int. Cl.
| | | |
|---|---|---|
| H01L 27/02 | (2006.01) | |
| H01L 23/522 | (2006.01) | |
| H01L 23/528 | (2006.01) | |
| H01L 29/417 | (2006.01) | |
| H01L 25/07 | (2006.01) | |

(52) U.S. Cl.
CPC ........ *H01L 27/0207* (2013.01); *H01L 23/522* (2013.01); *H01L 23/5221* (2013.01); *H01L 23/5226* (2013.01); *H01L 23/5283* (2013.01); *H01L 25/072* (2013.01); *H01L 29/41758* (2013.01); *H01L 23/5286* (2013.01)

(58) Field of Classification Search
CPC ... H01L 27/088; H01L 23/522; H01L 23/528; H01L 23/5283; H01L 23/5226; H01L 27/0207; H01L 257/211; H01L 29/0696; H01L 29/41758; H01L 29/0692; H01L 23/4824; H01L 29/4238
USPC .......... 257/401, 211, 758, 773–776, E23.06, 257/E23.011, E23.079
See application file for complete search history.

(56) References Cited

U.S. PATENT DOCUMENTS

| | | | | |
|---|---|---|---|---|
| 5,355,008 | A * | 10/1994 | Moyer et al. ................ | 257/341 |
| 5,838,050 | A * | 11/1998 | Ker et al. ....................... | 257/401 |
| 6,825,536 | B2 | 11/2004 | Disney et al. | |
| 7,112,855 | B2 * | 9/2006 | Fong ............................ | 257/382 |
| 7,132,717 | B2 | 11/2006 | Su et al. | |
| 2003/0213997 | A1 | 11/2003 | Parker et al. | |
| 2005/0161706 | A1 * | 7/2005 | Sutardja ........................ | 257/211 |
| 2007/0295996 | A1 * | 12/2007 | Mallikararjunaswamy .. | 257/204 |
| 2008/0303097 | A1 | 12/2008 | Alter et al. | |
| 2010/0213514 | A1 * | 8/2010 | Liaw ............................. | 257/207 |

* cited by examiner

*Primary Examiner* — Phat X Cao
*Assistant Examiner* — Diana C Vieira
(74) *Attorney, Agent, or Firm* — Van Pelt, Yi & James LLP (57) ABSTRACT

A lateral power MOSFET structure is disclosed. In some embodiments, a semiconductor device comprises substantially concentric source, channel, and drain regions; a metal layer at least in part comprising a drain plane disposed over the source, channel, and drain regions; and a metal layer at least in part comprising a source plane disposed over the source, channel, and drain regions.

36 Claims, 6 Drawing Sheets

LATERAL POWER MOSFET

CROSS REFERENCE TO OTHER APPLICATIONS

This application claims priority to U.S. Provisional Patent Application No. 61/342,591 entitled LOW RDS-ON POWER FET, filed Apr. 16, 2010, which is incorporated herein by reference for all purposes.

BACKGROUND OF THE INVENTION

Existing power MOSFET (Metal Oxide Semiconductor Field Effect Transistor) devices suffer many limitations. For example, existing vertical power MOSFET devices cannot be integrated with other CMOS (Complementary Metal Oxide Semiconductor) circuitry, and existing lateral power MOSFET devices typically exhibit undesirable resistances.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

MOSFET (Metal Oxide Semiconductor Field Effect Transistor) devices, including power MOSFET devices, have many applications in electronic systems. For example, MOSFET devices are commonly employed as switches. An important characteristic of a MOSFET when employed as a switch element is its resistance when the switch is closed or in an "on" state. This resistance is typically referred to as Rds-on and denotes the on-state drain to source resistance of the MOSFET. Low Rds-on is desirable in many applications, including switching applications, since lower resistance in many cases equates to lower voltage drop across the device, higher efficiency, higher current density, and lower temperature rise due to higher current carrying capability. Channel resistance, source and drain diffusion resistances, source and drain metal resistances, and source and drain bond wire resistances contribute to the Rds-on of a MOSFET. In many cases such as devices with less than 50 m$\Omega$ of total Rds-on, the total source and drain metal resistances comprise dominant resistances contributing to the total Rds-on. Another important MOSFET characteristic, which relates directly to economic as well as manufacturing considerations, is the size of the device in die area relative to its current carrying capacity. This characteristic is typically represented by the product of Rds-on and area ($\Omega$ mils$^2$). A smaller device form factor or area permits a larger number of devices to be placed on a die of a given size, and a lower Rds-on permits a device having a given die size to carry more current. A further key consideration in electronic systems is the ability to integrate MOSFET devices with other devices onto a single chip. For example, in some cases, it may be desirable for monolithic CMOS (Complementary Metal Oxide Semiconductor) components such as power management components (e.g., DC to DC power supplies), low drop out regulators, load switches, half bridges, audio amplifiers, power amplifiers, etc., to combine MOSFET switches and other circuitry as single chip devices.

Power MOSFETs typically comprise an array of MOSFET cells. Power MOSFET structures currently in prevalent use generally comprise either vertical or lateral configurations. Vertical power MOSFET structures are typically relegated to high power applications. Due to their vertical construction, integration with other CMOS circuitry (e.g., that includes NMOS and/or PMOS devices) is not practical in many cases. Current passes vertically through vertical power MOSFETs. Vertical power MOSFET arrays may be constructed to demonstrate very low $\Omega$ mils$^2$ values since the top layer of a corresponding die may comprise a metal source plane having unobstructed metal coverage. In such vertical devices, the current path comprises a bottom drain layer, which is connected to the bottom of a corresponding die. Lateral power MOSFETs have widespread use in cases in which it is desirable to integrate power MOSFETs with other CMOS circuitry on the same die. However, existing lateral power MOSFET constructions suffer from various limitations. The prevailing lateral power MOSFET structure comprises thin strips of metal, commonly referred to as "fingers", overlaying an array of lateral MOSFET cells. In such configurations, the metal lines interconnecting the sources and drains exhibit high line resistances due to the relatively high inherent resistances of the thin and long metal finger geometries. Moreover, when scaled to low process geometries, attempts to achieve lower $\Omega$ mils$^2$ values and higher current densities may result in added cells in associated arrays that do not contribute to increases in current carrying capacity.

A low Rds-on, high current, lateral power MOSFET design that comprises a plurality of metal planes or plates, rather than thin metals strips or fingers, to interconnect an array of lateral MOSFET cells is disclosed herein. In some embodiments, each MOSFET cell comprises concentric closed-shaped drain, gate/channel, and/or source regions. The disclosed lateral design offers many advantages, including improved performance and reduced manufacturing costs, resulting from exhibiting features such as low Rds-on values, low $\Omega$ mils$^2$ values that are comparable with those achievable with vertical power MOSFETs, process compatibility that permits integration with other CMOS devices on a single die or integrated circuit, low die area to current carrying ratio, etc. Although many of the given examples are with respect to a lateral power MOSFET array, the disclosed MOSFET design may be employed with respect to any other configuration and/or for any other application in other embodiments and is not limited to power MOSFET applications.

Figure 1:
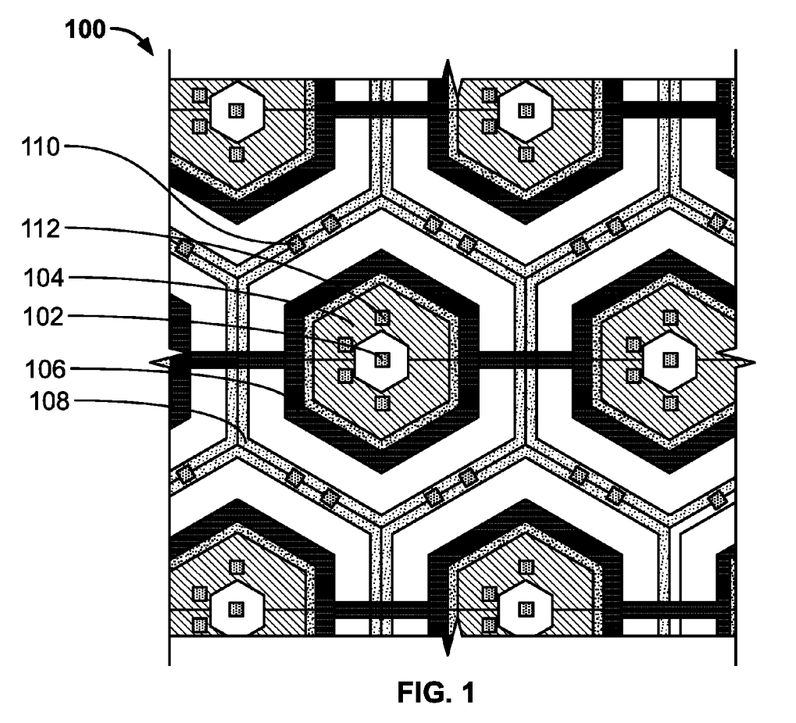
FIG. 1 illustrates a top view of an embodiment of a layout of a closed-cell, lateral power MOSFET array.

FIG. 1 illustrates a top view of an embodiment of a layout of a closed-cell, lateral power MOSFET array. As depicted, lateral power MOSFET array 100 comprises hexagon-shaped cells comprising concentric closed-shaped drain, gate/channel, and source regions. In the given example, each cell comprises a central body contact 102, which is encircled by a hexagonal doughnut-shaped source region 104. Source 104 is encircled by a hexagonal ring-shaped gate 106. In various embodiments, gate 106 may comprise any appropriate material such as polysilicon or silicide polysilicon. Gate 106 is, in turn, encircled by a hexagonal ring-shaped drain region 108. The depicted cell geometry results in a concentric, closed-shaped channel region controlled by gate 106 between drain 108 and source 104. Contacts associated with various regions are depicted as squares in the given figures. Any number and/or configuration of contacts may be employed in various embodiments depending on different design specifications and/or considerations. Drain currents flow through the drain contacts such as drain contact 110, across the channel region controlled by the gate, and out through the source contacts such as source contact 112. In some embodiments, the cells of a power MOSFET array, such as array 100, are interconnected in parallel. The MOSFET body may be connected by one or more body contacts such as body contact 102 to source region 104 at an overlaying metal layer. In some embodiments, the power MOSFET structure comprises a plurality of metal layers for connecting the source and drain regions. Any number, order, and/or configuration of metal or other conductive layers may be employed in various embodiments. In some cases, for example, drain regions are interconnected at one or more substantially parallel inner metal planes, and source regions are interconnected at an overlaying top metal plane. The lower level drain planes each have openings for source plates for connections to the top metal source plane. Higher metal layers are connected with vias to lower planes and plates, and the top metal layer in the stack ties together all sources in this embodiment. The combination of relatively low source and drain metal resistances resulting from the more planer geometries of the overlaying metal layers facilitates relatively lower Rds-on values and higher current carrying capabilities in this lateral configuration, compared to, for example, lateral configurations having metal finger interconnects, as well as very low $\Omega$ mils$^2$ values that approach those of vertical devices.

MOSFET array 100 may comprise NMOS or PMOS cells in various embodiments. For example, each cell of an NMOS array may comprise a P+ body contact 102, an N+ source region 104, a polysilicon or silicide polysilicon gate 106, and an N+ drain region 108 while each cell of a PMOS array may comprise an N+ body contact 102, a P+ source region 104, a polysilicon or silicide polysilicon gate 106, and a P+ drain region 108. In some embodiments of the MOSFET design, the drain and source regions may be transposed such that a central drain region is surrounded by an outer source region. In some embodiments, the disclosed MOSFET design comprises a high voltage device, although in other embodiments, other gate processes may be employed such as lower voltage processes or very high voltage processes. The hexagonal cells in the embodiment of FIG. 1 are arrayed in a honeycomb pattern that fully utilizes the surface area of an associated die. In other embodiments, the cells may comprise any other appropriate closed-shape structures such as octagons, squares, rectangles, circles, etc., and/or shapes with semi-open structures.

Figure 2:
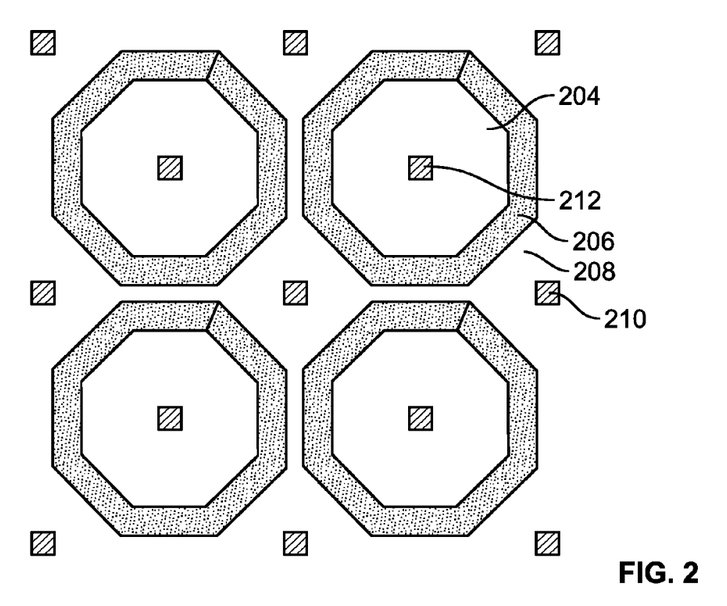
FIG. 2 illustrates a top view of an embodiment of a layout of a closed-cell, lateral power MOSFET array comprising octagon shaped cells.

FIG. 2 illustrates a top view of an embodiment of a layout of a closed-cell, lateral power MOSFET array comprising octagon shaped cells. As depicted, a central, octagonal doughnut-shaped source diffusion region 204 is surrounded by an octagonal ring-shaped gate 206, which is, in turn, surrounded by an octagonal ring-shaped drain diffusion region 208. Drain currents flow through the drain contacts such as drain contact 210, across the channel region controlled by gate 206, and out through the source contacts such as source contact 212.

Figure 3:
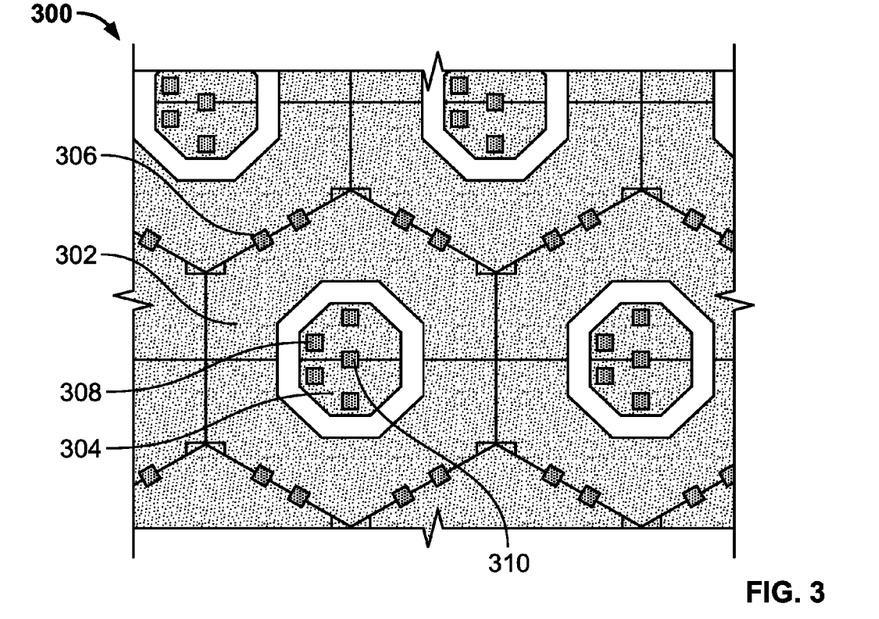
FIG. 3 illustrates a top view of an embodiment of a metal 1 layer for a hexagonal cell array.

FIG. 3 illustrates a top view of an embodiment of a metal 1 layer for a hexagonal cell array such as that of FIG. 1. As depicted, layer 300 comprises metal 1 drain plane 302 as well as metal 1 source/body plates such as plate 304. Drain contacts such as drain contact 306 and source contacts such as source contact 308 connect the associated diffusion regions to the metal 1 layer. The source and body regions may be tied together at the metal 1 layer, with the body connected to the source, for example, at source/body plate 304. In such cases, contact 310 comprises body contact 102. In some embodiments, each cell in the array may tie the body to the source via a body contact such as contact 310. In other embodiments, only a subset of one or more cells in the array may tie the body to the source via body contacts such as contact 310. Alternatively, the body may be connected outside of the associated power MOSFET in other embodiments, e.g., if a smaller device dimension is desirable.

Figure 4:
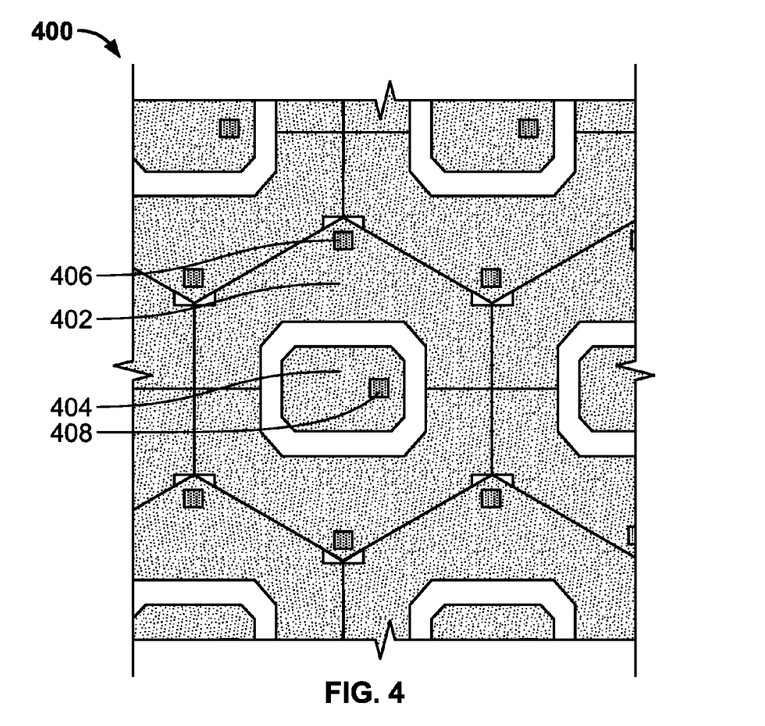
FIG. 4 illustrates a top view of an embodiment of a metal 2 layer for a hexagonal cell array.

FIG. 4 illustrates a top view of an embodiment of a metal 2 layer for a hexagonal cell array. For example, metal 2 layer 400 may overlay metal 1 layer 300 of FIG. 3. As depicted, layer 400 comprises metal 2 drain plane 402 as well as metal 2 source/body plates such as plate 404. Metal 2 drain plane 402 is connected to metal 1 drain plane 302 by vias such as via 406, and metal 2 source/body plates 404 are connected to metal 1 source/body plates 304 by vias such as via 408. Any further metal drain plane layers may have a configuration similar to layer 400 of FIG. 4.

FIGS. 3 and 4 illustrate two layers of metal drain planes. In various embodiments, a design may comprise any number of metal drain planes. In the examples of FIGS. 3 and 4, each metal drain plane is mostly, although not completely, planar since each has openings or holes for the source/body plates. Electrical isolation in a layer between the drain plane and source/body plates may be achieved by an insulating material such as glass. Maximizing drain plane area in a layer, for example, by minimizing the area occupied by the source/body plates of a layer, may in some embodiments be a design objective to achieve as low a resistance or equivalently as high a current carrying capacity as possible.

Figure 5:
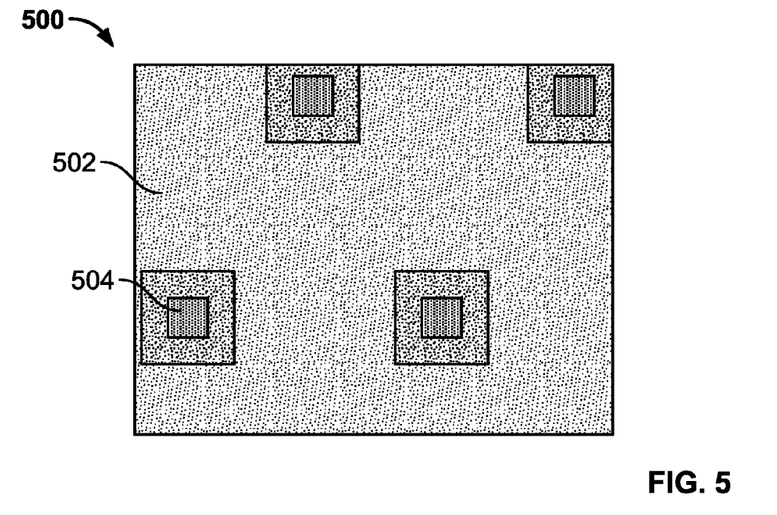
FIG. 5 illustrates a top view of an embodiment of a top metal layer.

FIG. 5 illustrates a top view of an embodiment of a top metal layer. In some cases, top metal layer 500 overlays the highest metal drain plane layer. In a design that comprises two metal drain plane layers, for instance, layer 500 may comprise a metal 3 layer that overlays metal 2 layer 400 of FIG. 4. In the given example, layer 500 comprises source/body plane 502, which is connected to directly lower level source/body plates with vias such as via 504. For instance, metal 3 source/body plane 502 may be connected to metal 2 source/body plates 404 of layer 400. In some embodiments, plane 502 has the lowest resistance of planes 302, 402, and 502 since its geometry has the least interruptions, i.e., since it is has the most planar geometry. In some cases, plane 502 comprises a sufficiently low resistance such that special processing steps such as thick metal electroplating are not necessary to achieve a target resistance. Multiple wire bonds or solder balls may be placed directly on top metal layer 500, and lower metal drain planes may be connected to complementary top metal drain areas for wire bonding as further described below with respect to FIGS. 6 and 7.

Figure 6:
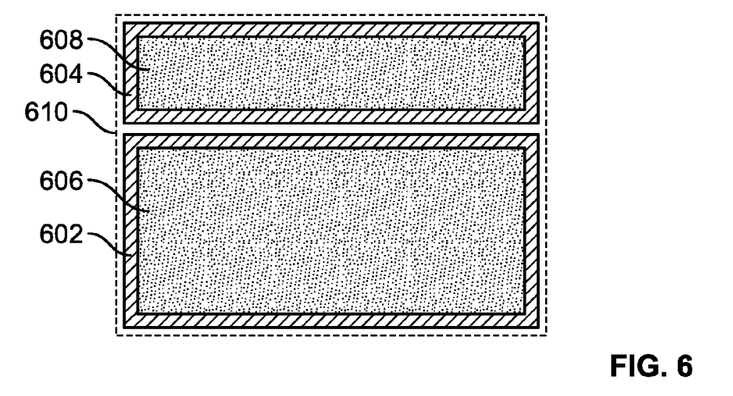
FIG. 6 illustrates an embodiment of source and drain bonding connections in the topmost metal layer.

FIG. 6 illustrates an embodiment of source and drain bonding connections in the topmost metal layer. In some embodiments, the topmost metal layer, such as metal layer 500 of FIG. 5, comprises a top metal source plane 602 as well as a top metal drain plane 604. In other embodiments, the topmost metal layer may comprise any number of source and drain planes depending on design considerations. As depicted, source passivation opening for bonding 606 is situated over top metal source plane 602 while drain passivation opening for bonding 608 is situated over top metal drain plane 604. Top metal drain plane 604 is connected with vias to lower metal drain planes 610, which may be extended to connect to top metal drain plane 604.

Figure 7:
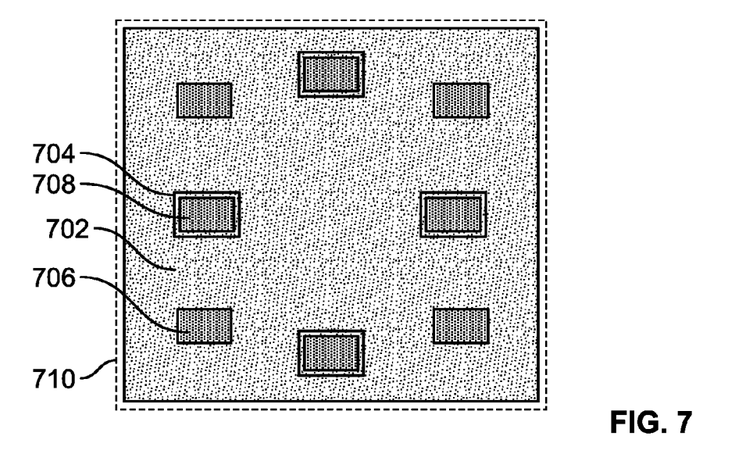
FIG. 7 illustrates an embodiment of source and drain bonding connections in the topmost metal layer.

FIG. 7 illustrates an embodiment of source and drain bonding connections in the topmost metal layer. In some embodiments, the topmost metal layer, such as metal layer 500 of FIG. 5, comprises a top metal source plane 702 as well as top metal drain plane regions such as drain plane 704 constructed by opening top metal source plane 702. As depicted, source passivation openings for bonding such as rectangular opening 706 are situated over top metal source plane 702 while drain passivation openings for bonding such as rectangular opening 708 are situated over top metal drain planes such as drain plane 704. Top metal drain planes such as drain plane 704 are connected with vias to lower metal drain planes 710.

Figure 8A:
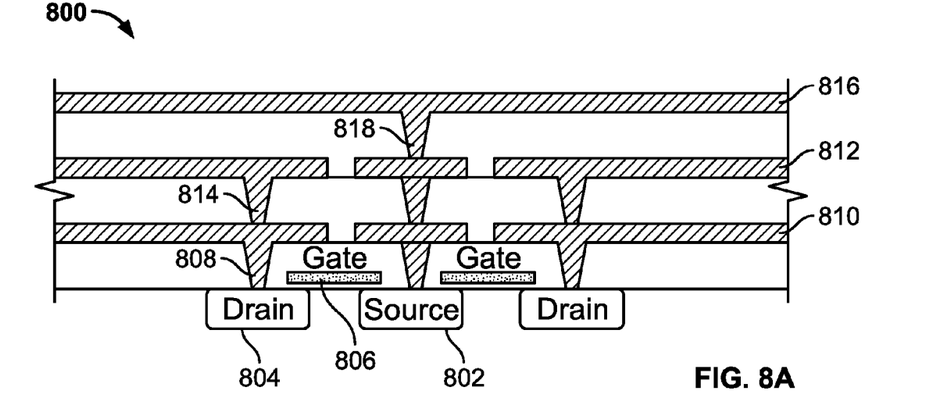
FIGS. 8A-8C illustrate cross-sectional views of embodiments of lateral power MOSFET devices.
Figure 8B:
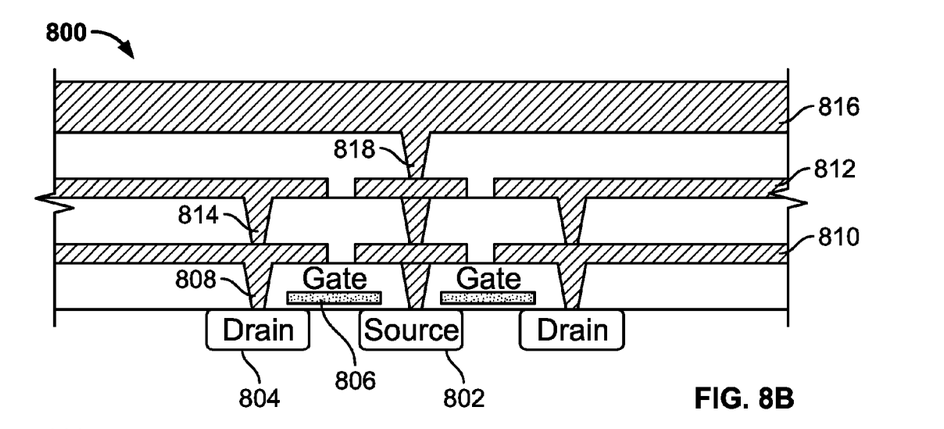
Figure 8C:
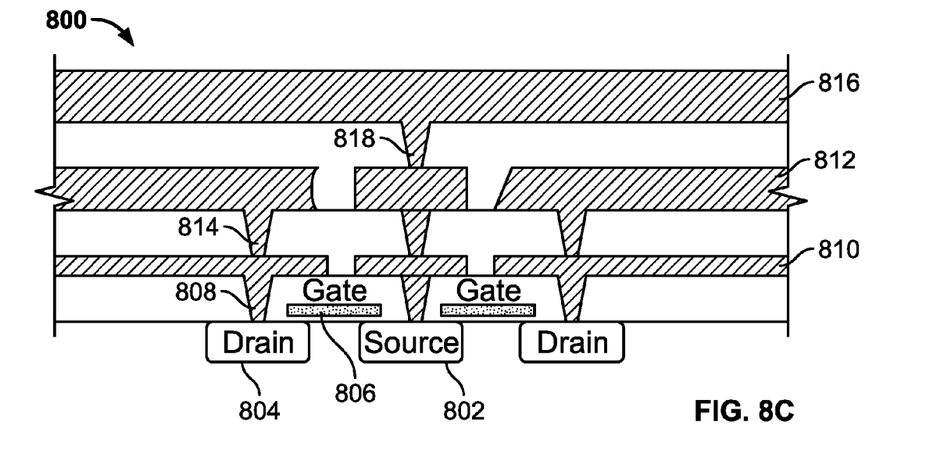

FIGS. 8A-8C illustrate cross-sectional views of embodiments of lateral power MOSFET devices. For example, the cross-sectional views of FIGS. 8A-8C may comprise the layers described with respect to FIGS. 1, 3, 4, and 5. In the examples of FIGS. 8A-8C, power MOSFET 800 comprises two metal layers of drain plane and source/body plates and a third top metal source plane layer. Each cell of the MOSFET array comprises closed-shaped, concentric source 802 and drain 804 diffusion regions as well as a similarly shaped gate 806 that controls a concentric channel region between source 802 and drain 804. Source 802 and drain 804 diffusion regions are connected by contacts such as contact 808 to a metal 1 layer 810 comprising a drain plane with openings for source/body plates. A metal 2 layer 812 comprising a second drain plane with openings for source/body plates is connected to corresponding portions of metal 1 layer 810 by vias such as via 814. A topmost metal 3 layer 816 comprising a source plane is connected to the source/body plates of metal 2 layer 812 by vias such as via 818. In the example of FIG. 8A, all metal layers have the same thicknesses. In the example of FIG. 8B, top metal source plane comprises a thicker layer of metal such as copper to achieve even lower top plane resistances or equivalently higher top plane current carrying capacities. In the example of FIG. 8C, a thicker inner metal layer (i.e., metal 2 layer 812) further increases the current carrying capability of the device, which may be designed, for example, to carry as much as 20 A in some cases.

Although the examples of FIGS. 1, 3, 4, 5, and 8A-8C describe three metal layers, in various embodiments, a device may comprise any number of metal layers, and each layer may comprise any appropriate material and thickness. Moreover, any number of layers may be employed for the source and drain planes, and each of the source and drain planes may comprise substantially, if not completely, planar geometries. Furthermore, the various metal layers may be organized in any appropriate order. For example, in some embodiments, the topmost metal layer may comprise a drain plane, and an inner metal layer may comprise a source plane with openings for drain plates. In some embodiments, the gates of a device may be interconnected with a metal layer. In some embodiments, the metal layers of a device may comprise a combination of planar, finger, and/or any other appropriate geometries.

Figure 9A:
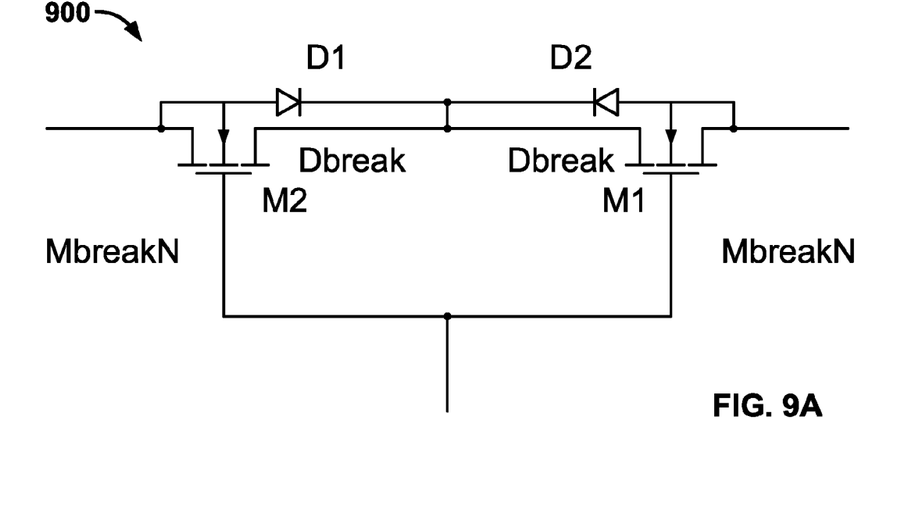
FIG. 9A is a circuit diagram illustrating an embodiment of an application of a power MOSFET.
Figure 9B:
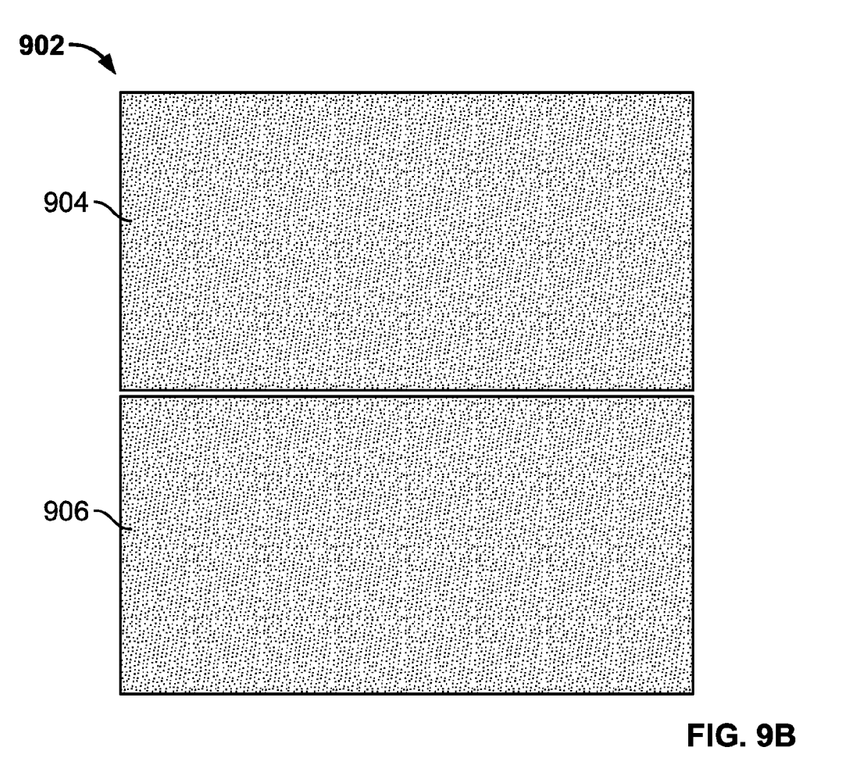
FIG. 9B illustrates a top view of an embodiment of a top metal layer of the circuit of FIG. 9A.

FIG. 9A is a circuit diagram illustrating an embodiment of an application of a power MOSFET. As depicted, circuit 900 comprises a bi-directional back-to-back configuration of power FETs that share a common drain. In this embodiment, the lower level drain planes may simply be connected together, and the drains do not have to be brought up to the topmost metal layer. FIG. 9B illustrates a top view of an embodiment of a top metal layer of such a device. As depicted, top metal layer 902 comprises source planes 904 and 906 for the sources of the device but no connections to the drain planes. The configuration of FIGS. 9A-9B may be employed in applications in which bi-directional isolation is desirable such as in battery charging circuits.

Figure 10:
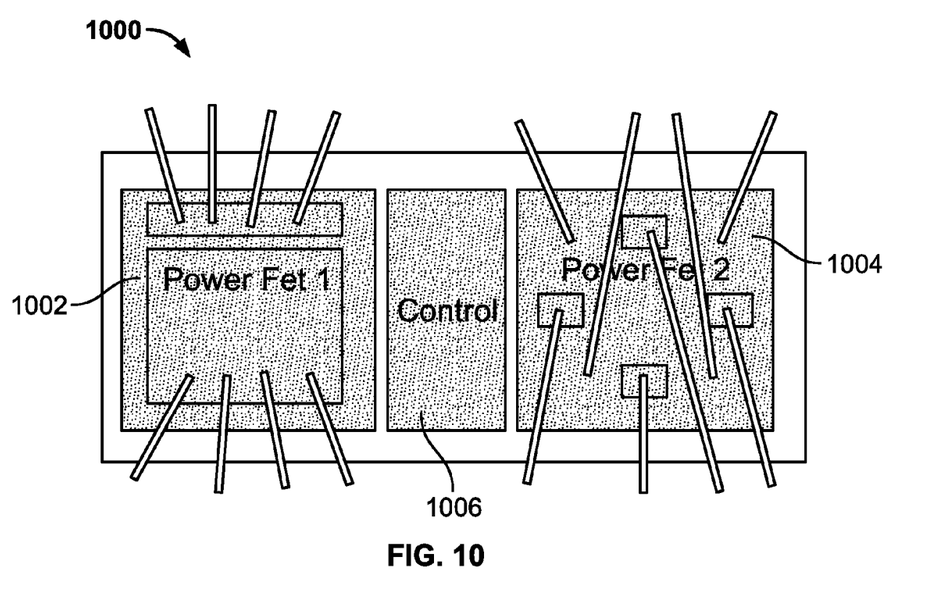
FIG. 10 illustrates an embodiment of integrating power MOSFETs with other CMOS circuitry.

FIG. 10 illustrates an embodiment of integrating power MOSFETs with other CMOS circuitry. As depicted, power FETs 1002 and 1004 as well as control circuitry 1006 are combined on the same die or integrated circuit 1000. Power FET 1002 comprises bonding connections of the embodiment of FIG. 6 while power FET 1004 comprises bonding connections of the embodiment of FIG. 7. Exemplary wire bonds that connect to the pins of a corresponding package are also depicted.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A semiconductor device, comprising:
   a source region completely surrounded by substantially concentric channel and drain regions and a central body contact encircled by the source region;
   a first inner metal layer comprising a first drain plane disposed over the source, channel, and drain regions, wherein the first inner metal layer comprises a single plane that has one or more openings for connections;
   a second inner metal layer comprising a second drain plane disposed over the first inner metal layer, wherein the second inner metal layer comprises a single plane that has one or more openings for connections; and
   a top metal layer comprising a top source plane disposed over the inner metal layers, wherein the top source plane comprises a single plane that substantially comprises the top metal layer.

2. The semiconductor device of claim 1, wherein each of the source, channel, and drain regions comprises a closed shape.

3. The semiconductor device of claim 1, wherein each of the source, channel, and drain regions comprises a doughnut or a ring shape.

4. The semiconductor device of claim 1, wherein each of the source, channel, and drain regions comprises a hexagon, octagon, square, rectangle, or circle.

5. The semiconductor device of claim 1, further comprising a gate that controls the channel region, wherein the gate has a similar shape as and is substantially concentrically situated between the source and drain regions.

6. The semiconductor device of claim 1, wherein the first inner metal layer and the second inner metal layer comprise source plates in the corresponding one or more openings.

7. The semiconductor device of claim 1, wherein the source, channel, and drain regions are substantially identically shaped.

8. The semiconductor device of claim 1, further comprising one or more additional inner metal layers comprising one or more additional drain planes, source planes, or both.

9. The semiconductor device of claim 1, wherein the source region is connected to a body of the semiconductor device at an overlaying metal layer.

10. The semiconductor device of claim 1, wherein the top metal layer has fewer interruptions and a lower resistance than any of the inner metal layers.

11. The semiconductor device of claim 1, wherein the source and drain regions are connected to corresponding overlaying metal layers by one or more associated contacts.

12. The semiconductor device of claim 1, wherein different metal layers have different thicknesses.

13. The semiconductor device of claim 1, wherein the top metal layer is thicker than any of the inner metal layers.

14. The semiconductor device of claim 1, wherein the source, channel, and drain regions comprise a single cell of an array of cells comprising the semiconductor device.

15. The semiconductor device of claim 14, wherein at least a subset of cells comprising the array are connected in parallel.

16. The semiconductor device of claim 1, wherein the source, channel, and drain regions are associated with a first MOSFET (Metal Oxide Semiconductor Field Effect Transistor) and further comprising source, channel, and drain regions associated with a second MOSFET, wherein the first MOSFET and the second MOSFET are connected in a bi-directional back-to-back configuration.

17. The semiconductor device of claim 1, wherein the semiconductor device is integrated on a same die with other circuitry.

18. The semiconductor device of claim 1, wherein the semiconductor device comprises a lateral power MOSFET (Metal Oxide Semiconductor Field Effect Transistor).

19. A method for constructing a semiconductor device, comprising:
   configuring a source region to be completely surrounded by substantially concentric channel and drain regions and wherein the source region encircles a central body contact;
   disposing over the source, channel, and drain regions a first inner metal layer comprising a first drain plane, wherein the first inner metal layer comprises a single plane that has one or more openings for connections;
   disposing over the first inner metal layer a second inner metal layer comprising a second drain plane, wherein the second inner metal layer comprises a single plane that has one or more openings for connections; and
   disposing over the inner metal layers a top metal layer comprising a top source plane, wherein the top source plane comprises a single plane that substantially comprises the top metal layer.

20. The method of claim 19, wherein each of the source, channel, and drain regions comprises a closed shape.

21. The method of claim 19, wherein each of the source, channel, and drain regions comprises a doughnut or a ring shape.

22. The method of claim 19, wherein each of the source, channel, and drain regions comprises a hexagon, octagon, square, rectangle, or circle.

23. The method of claim 19, further comprising configuring a gate that controls the channel region, wherein the gate has a similar shape as and is substantially concentrically situated between the source and drain regions.

24. The method of claim 19, wherein the first inner metal layer and the second inner metal layer comprise source plates in the corresponding one or more openings.

25. The method of claim 19, wherein the source, channel, and drain regions are substantially identically shaped.

26. The method of claim 19, further comprising disposing one or more additional inner metal layers comprising one or more additional drain planes, source planes, or both.

27. The method of claim 19, wherein the source region is connected to a body of the semiconductor device at an overlaying metal layer.

28. The method of claim 19, wherein the top metal layer has fewer interruptions and a lower resistance than any of the inner metal layers.

29. The method of claim 19, wherein the source and drain regions are connected to corresponding overlaying metal layers by one or more associated contacts.

30. The method of claim 19, wherein different metal layers have different thicknesses.

31. The method of claim 19, wherein the top metal layer is thicker than any of the inner metal layers.

32. The method of claim 19, wherein the source, channel, and drain regions comprise a single cell of an array of cells comprising the semiconductor device.

33. The method of claim 32, wherein at least a subset of cells comprising the array are connected in parallel.

34. The method of claim 19, wherein the source, channel, and drain regions are associated with a first MOSFET (Metal Oxide Semiconductor Field Effect Transistor) and further comprising source, channel, and drain regions associated with a second MOSFET, wherein the first MOSFET and the second MOSFET are connected in a bi-directional back-to-back configuration.

35. The method of claim 19, wherein the semiconductor device is integrated on a same die with other circuitry.

36. The method of claim 19, wherein the semiconductor device comprises a lateral power MOSFET (Metal Oxide Semiconductor Field Effect Transistor).

* * * * *